(12) United States Patent
Lin et al.

(10) Patent No.: US 8,079,139 B1
(45) Date of Patent: Dec. 20, 2011

(54) METHOD FOR PRODUCING ELECTRO-THERMAL SEPARATION TYPE LIGHT EMITTING DIODE SUPPORT STRUCTURE

(75) Inventors: Shih Chieh Lin, Taipei (TW); Li Min Chen, Taipei (TW); Yung Chieh Chen, Taipei (TW)

(73) Assignee: I-Chiun Precision Industry Co., Ltd., Taipei (TW)

(*) Notice: Subject to any disclaimer, the term of this patent is extended or adjusted under 35 U.S.C. 154(b) by 0 days.

(21) Appl. No.: 12/805,976

(22) Filed: Aug. 27, 2010

(51) Int. Cl.
*H01R 43/00* (2006.01)

(52) U.S. Cl. ........... 29/825; 29/827; 29/832; 29/840; 257/99; 257/100; 257/675; 257/676

(58) Field of Classification Search ............ 29/825, 29/830, 832, 840, 827; 257/99, 100, 675, 257/676

See application file for complete search history.

(56) References Cited

U.S. PATENT DOCUMENTS

| | | | |
|---|---|---|---|
| 6,274,924 B1 * | 8/2001 | Carey et al. | 257/676 |
| 2004/0075100 A1 * | 4/2004 | Bogner et al. | 257/99 |
| 2007/0001290 A1 * | 1/2007 | Wong et al. | 257/706 |
| 2010/0148196 A1 * | 6/2010 | Kamada et al. | 257/98 |

* cited by examiner

*Primary Examiner* — Carl Arbes

(74) *Attorney, Agent, or Firm* — Ming Chow; Sinorica, LLC

(57) ABSTRACT

A method for producing an electro-thermal separation type light emitting diode support structure is provided. One of the embodiments for the support structure has at least two heat dissipation bases and at least two conductive supports which are coupled by a heat dissipation plate and a support plate. Another embodiment for the support structure has at least two heat dissipation bases and at least two conductive supports which are formed by a thick-thin plate. The light emitting diode chips of different types can be configured on the heat dissipation bases of these designs, respectively. Therefore, the invention achieves the goal of using different types of light emitting diode chips at the same time.

10 Claims, 11 Drawing Sheets

METHOD FOR PRODUCING ELECTRO-THERMAL SEPARATION TYPE LIGHT EMITTING DIODE SUPPORT STRUCTURE

BACKGROUND OF THE INVENTION

1. Field of Invention

The invention relates to a method for producing a light emitting diode (LED) support structure and, in particular, to a method of producing an electro-thermal separation type LED support structure. A heat dissipation plate and a support plate are coupled to form at least two heat dissipation bases and at least two conductive supports. Alternatively, a thick-thin plate is used to form at least two heat dissipation bases and at least two conductive supports. The LED chips of different types are configured on the heat dissipation bases, respectively.

2. Related Art

In recent years, the LED has become very popular for the indicators on information or communications devices and display devices. This is because it has the features of low power consumption, long lifetime, virtually no warm-up time, and fast reactions. Moreover, it has a small volume and is vibration-resistant, ideal for mass production. Therefore, they are widely used as the backlight source of mobile phones and personal digital assistants (PDA's), various outdoor displayers, traffic lights, and vehicle lights.

Normally, the LED chip is fixed onto a support in a plastic base with a concave part via a Surface Mount Device (SMD) or flip chip bonding. FIG. 1 is a side cross-sectional view of the LED chip with a first conventional LED support structure.

The plastic base 81 with a concave part 82 is embedded with at least two supports 83. Part of each support 83 is exposed in the concave part 82 of the plastic base 81. Part of each support 83 extends out of both sides of the plastic base 81 to form electrical connection parts 84 in order to electrically connect to other electronic devices (not shown).

Afterwards, the SMD is used to fix the LED chip 85 on one of the supports 83 in the concave part 82 of the plastic base 81. Wire bonding or flip chip bonding is then employed to electrically connect the LED chip 85 with the other support 83 via a wire 86. Finally, the concave part 82 of the plastic base 81 is filled with packaging plastic 87, thereby covering the LED chip 85 and the supports 83 in the concave part 82.

However, heat dissipation of the LED chip 85 in the above-mentioned LED support structure is via the supports 83 connected to the LED chip 85. At the same time, the supports 83 serve the function of electrical connection for the LED chip 85. Therefore, the supports 83 have lower heat dissipation efficiency for the LED chip 85. This method is thus not suitable for high-power LED chips 85.

A new electro-thermal separation type LED support structure has been proposed, as shown in FIG. 2. FIG. 2 is a top view of the LED chip with a second conventional LED support structure.

In this embodiment, the plastic base 81 with a concave part 82 is embedded with a heat dissipation base 88 and at least two supports 83. Part of the heat dissipation base 88 and each support 83 is exposed in the concave part 82 of the plastic base 81. Part of each support 83 extends out of both sides of the plastic base 81 to form electrical connection parts 84 for electrical connections with other electronic devices (not shown).

Afterwards, the SMD is used to fix the LED chip 85 on the heat dissipation base 88 in the concave part 82 of the plastic base 81. Wire bonding or flip chip bonding is employed to electrically connect the LED chip 85 with the supports 83 via wires 86. Finally, the concave part 82 of the plastic base 81 is filled with packaging glue 87 to cover the LED chip 85 therein, the heat dissipation base 88, and the supports 83.

Embedding the heat dissipation base 88 and the supports 83 in the plastic base 81 can effectively dissipate heat of the LED chip 85 while achieving the electrical separation design. The heat dissipation base 88 embedded in the plastic base 81 dissipates heat produced by the LED chip 85. The supports 83 embedded in the plastic base 81 provide electrical connections for the LED chip 85. This method enhances heat dissipation efficiency of the LED chip 85. Therefore, it solves the problem in the first conventional LED support structure.

However, since the second conventional LED support structure only embeds one heat dissipation base 88 in the plastic base, one has to use LED chips 85 of the same type (PNP or NPN) when several of them are configured on the heat dissipation base 88. That is, only LED chips 85 of the same type can be simultaneously configured on the heat dissipation base 88. This is a restriction to the use and electrical connection of the LED chip 85.

In summary, the prior art always has the problem that only LED chips of the same type can be used on the heat dissipation base. It is therefore desirable to provide a solution to remove such a constraint.

SUMMARY OF THE INVENTION

In view of the foregoing, the invention provides a method for producing an electro-thermal separation type LED support structure.

In a first embodiment of the invention, the method includes the following steps.

First, a heat dissipation plate is formed with at least two heat dissipation bases. A support plate is formed with at least two conductive supports. Afterwards, the heat dissipation plate and the support plate are coupled together so that at least two heat dissipation bases are configured between at least two conductive supports. Moreover, at least two heat dissipation bases and at least two conductive supports are not connected. Finally, at least two heat dissipation bases and at least two conductive supports are partially embedded into a plastic base. At least two heat dissipation bases and at least two conductive supports are partially exposed in a concave part of the plastic base. At least two conductive supports partially extend out of the plastic base.

In the above-mentioned method, the step of forming at least two heat dissipation bases on the heat dissipation plate is done through a stamping procedure. Also, the step of forming at least two conductive supports on the support plate is done through a stamping procedure.

In the above-mentioned method, the purpose of partially exposing at least two heat dissipation bases in the concave part of the plastic base is to fix the LED chips. The LED chips are electrically connected with any of the conductive supports that are partially exposed in the concave part. The concave part of the plastic base is further filled with a packaging plastic to cover the LED chip, thereby forming an SMD LED.

In a second embodiment of the invention, the method includes the following steps.

First, a thick-thin plate with different thicknesses is produced. At least two heat dissipation bases are formed at the thicker place of the thick-thin plate, and at least two conductive supports are formed at the thinner place thereof. The conductive supports and the heat dissipation bases are not connected. Finally, the heat dissipation bases and the conductive supports are partially embedded in the plastic base, and partially exposed in the concave part of the plastic base. The conductive supports partially extend out of the plastic base.

In the above-mentioned method, the step of forming at least two heat dissipation bases at the thicker place is achieved by a stamping procedure. The step of forming at least two conductive supports at the thinner place is achieved by a stamping procedure too. The heat dissipation bases and the conductive supports are not connected.

In the above-mentioned method, the purpose of partially exposing the heat dissipation bases in the concave part is to fix the LEP chips. The LED chip is in an electrical connection with any conductive support that is partially exposed in the concave part. The concave part of the plastic base is covered with packaging plastic to enclose the LED chips, forming an SMD LED.

The disclosed method differs from the prior art in that a heat dissipation plate and a support plate are coupled to form at least two heat dissipation bases and at least two conductive supports to have the electro-thermal separation design. Another embodiment uses a thick-thin plate to form at least two heat dissipation bases and at least two conductive supports to have electro-thermal separation. This embodiment allows the use of LED chips of different types. That is, LED chips of different type can be configured on the heat dissipation bases, having electrical connections with different conductive supports. Thus, the invention can freely use LED chips of different types, avoiding any limitation.

Using the above-mentioned techniques, the invention can achieve the goal of using LED chips of different types simultaneously.

BRIEF DESCRIPTION OF THE DRAWINGS

The invention will become more fully understood from the detailed description given herein below illustration only, and thus is not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1:
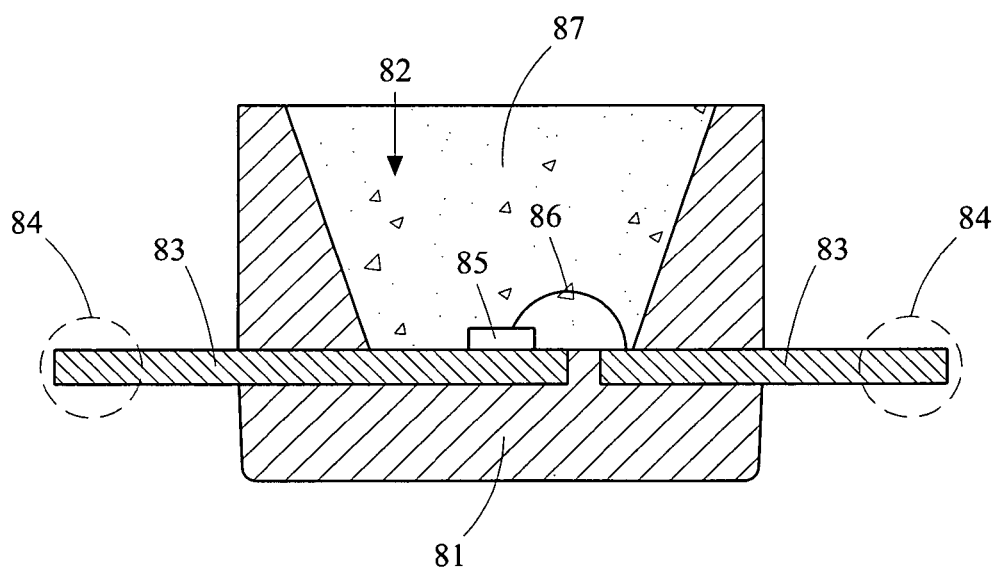
FIG. 1 is a side cross-sectional view of the LED chip configuration on a conventional LED support structure.
Figure 2:
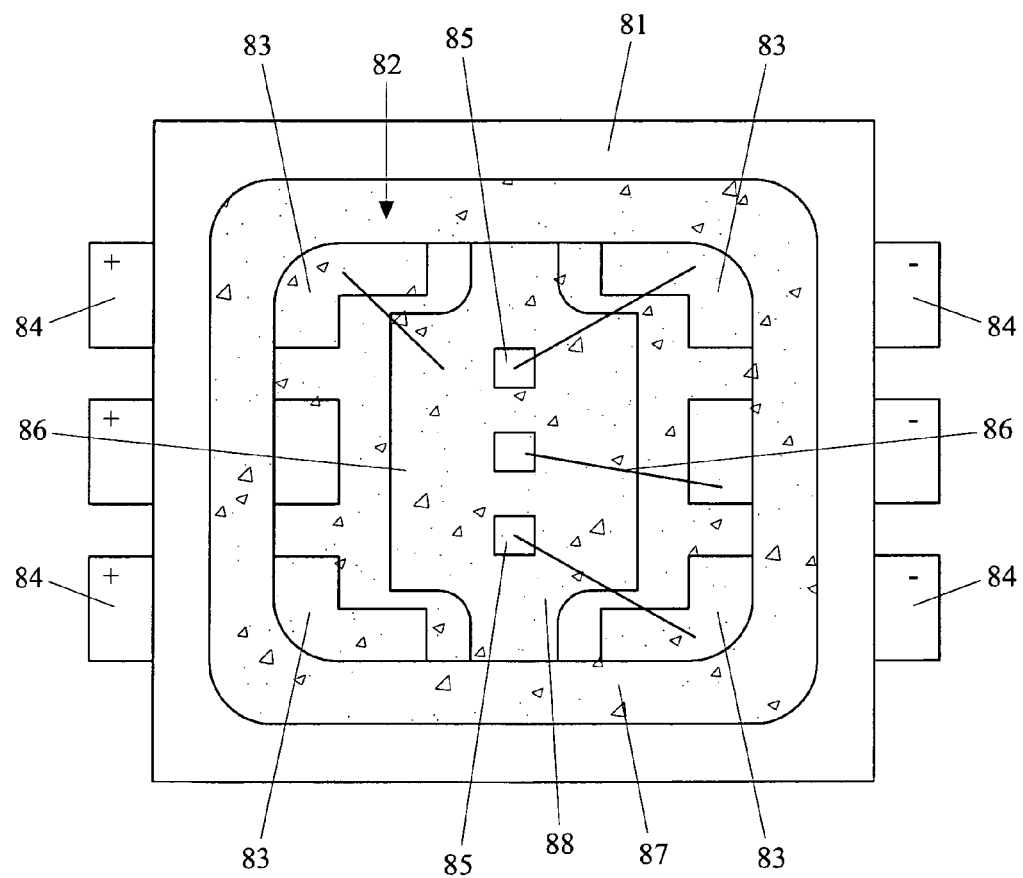
FIG. 2 is a top view of the LED chip configuration on another conventional LED support structure.
Figure 3:
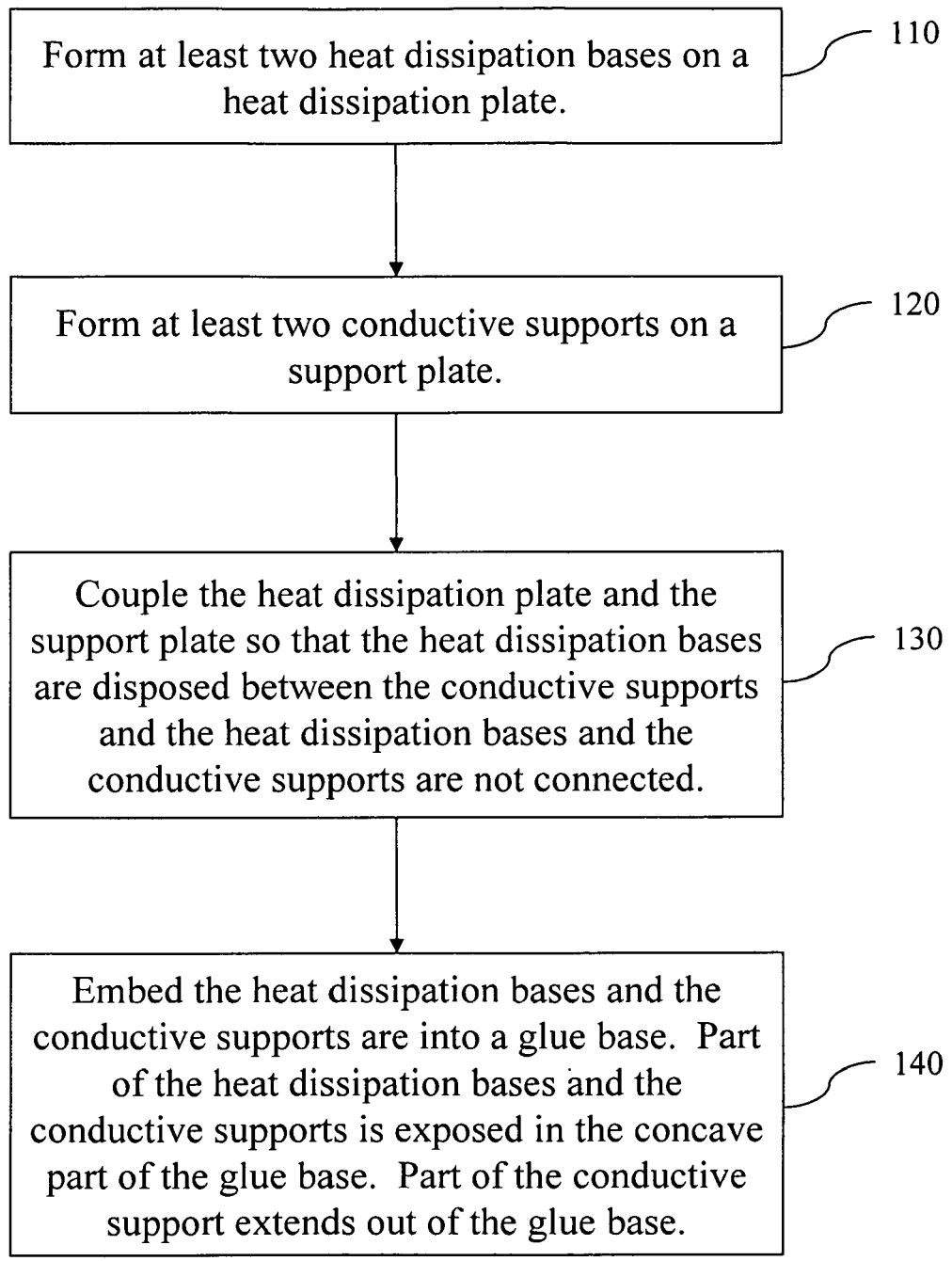
FIG. 3 is a flowchart of the method for producing an electro-thermal separation type LED support structure according to the first embodiment of the invention.
Figure 4:
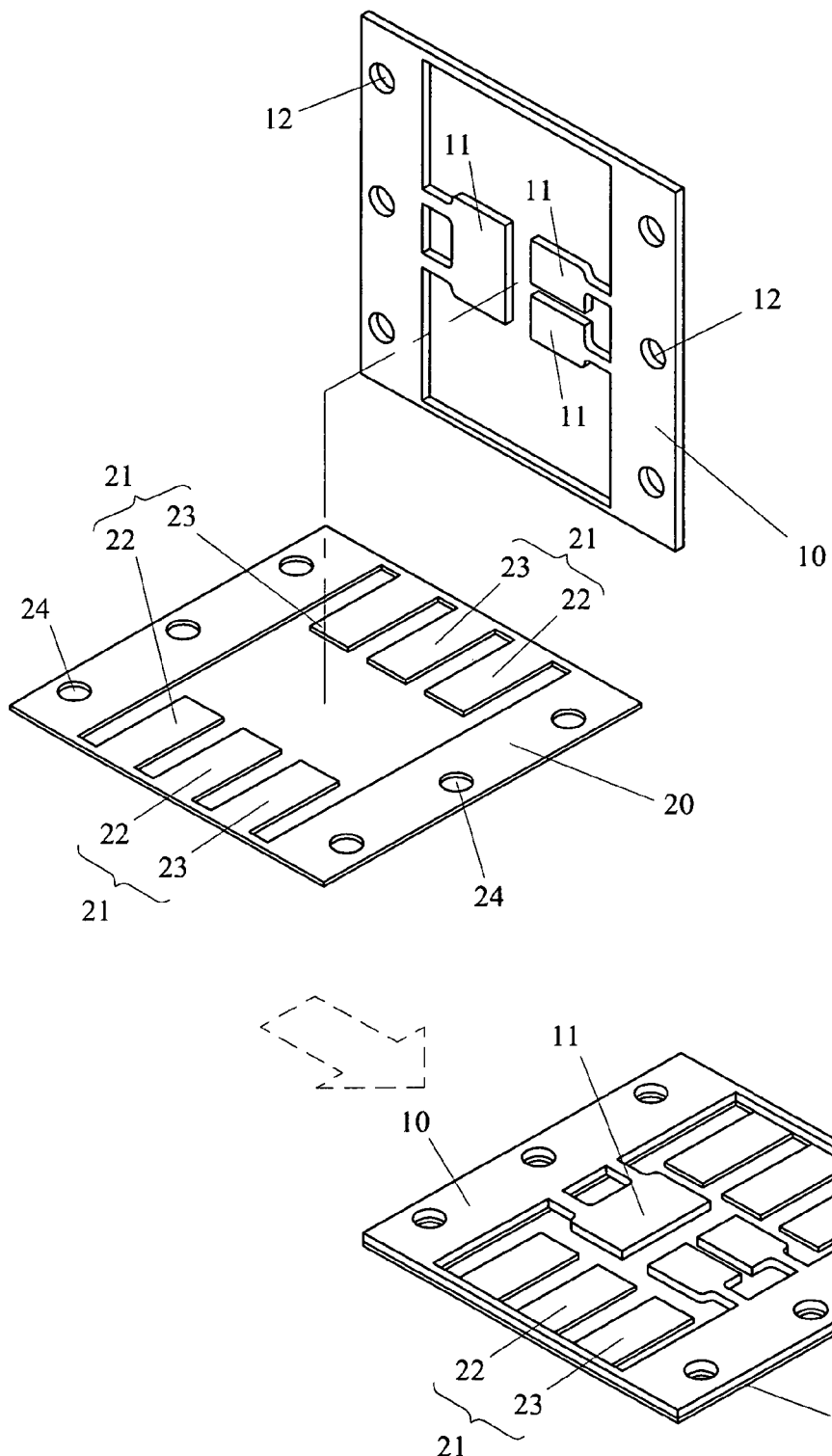
FIG. 4 is a three-dimensional view of the coupled heat dissipation plate and support plate in the disclosed electro-thermal separation type LED support structure.

The following paragraphs describe a first embodiment of the disclosed method of producing electro-thermal separation type LED support structure. Please refer simultaneously to FIGS. 3 and 4. FIG. 3 is a flowchart of the first embodiment. FIG. 4 is a three-dimensional view of the coupled heat dissipation plate and support plate in the disclosed electro-thermal separation type LED support structure.

First, a heat dissipation plate 10 with at least two heat dissipation bases 11 is made by stamping. That is, the heat dissipation plate 10 is formed with at least two heat dissipation bases 11 (step 110). A support plate 20 with at least two conductive supports 21 is made by stamping as well. That is, the support plate 20 is formed with at least two conductive supports 21 (step 120).

The number of conductive supports 21 on the support plate 20 is determined by the number of heat dissipation bases 11 on the heat dissipation plate 10. That is, the number of conductive supports 21 on the support plate 20 is the same as the number of heat dissipation bases 11 on the heat dissipation plate 10. Moreover, each conductive support 21 has an anode conductive support 22 and a cathode conductive support 23.

In FIG. 4, the heat dissipation plate 10 has three heat dissipation bases 11. Therefore, the support plate 20 is formed with three conductive supports 21. The numbers of heat dissipation bases 11 and conductive supports 21 in the drawing are only illustrative. The invention is not restricted by such examples.

The heat dissipation plate 10 and the support plate 20 are positioned and combined via the positioning parts 12, 24 on the heat dissipation plate 10 and the support plate 20, respectively. That is, the heat dissipation plate 10 and the support plate 20 are coupled so that the two heat dissipation bases 11 are disposed between the conductive supports 21 (step 130). It should be noted that the two heat dissipation bases 11 and the two conductive supports 21 are not connected. Therefore, heat dissipation and electrical connection are separate, resulting in electro-thermal separation.

The heat dissipation plate 10 and the support plate 20 are integrally formed. The above explanation and drawings illustrate how the heat dissipation plate 10 and the support plate 20 are produced. They should not be used to restrict the application scope of the invention.

The heat dissipation plate 10 with at least two heat dissipation bases 11 and the support plate 20 with at least two conductive supports 21 can be made from a metal plate or alloy plate of good electrical and thermal conductivities. For example, the heat dissipation plate 10 and the support plate 20 can be made of Cu, Fe, Al, Cu alloy, Fe alloy, Al alloy or other materials with good electrical and thermal conductivities. Thus, the heat dissipation bases 11 and the conductive supports 21 have good electrical and thermal conductivities. The invention, however, is not limited to these examples.

Figure 5:
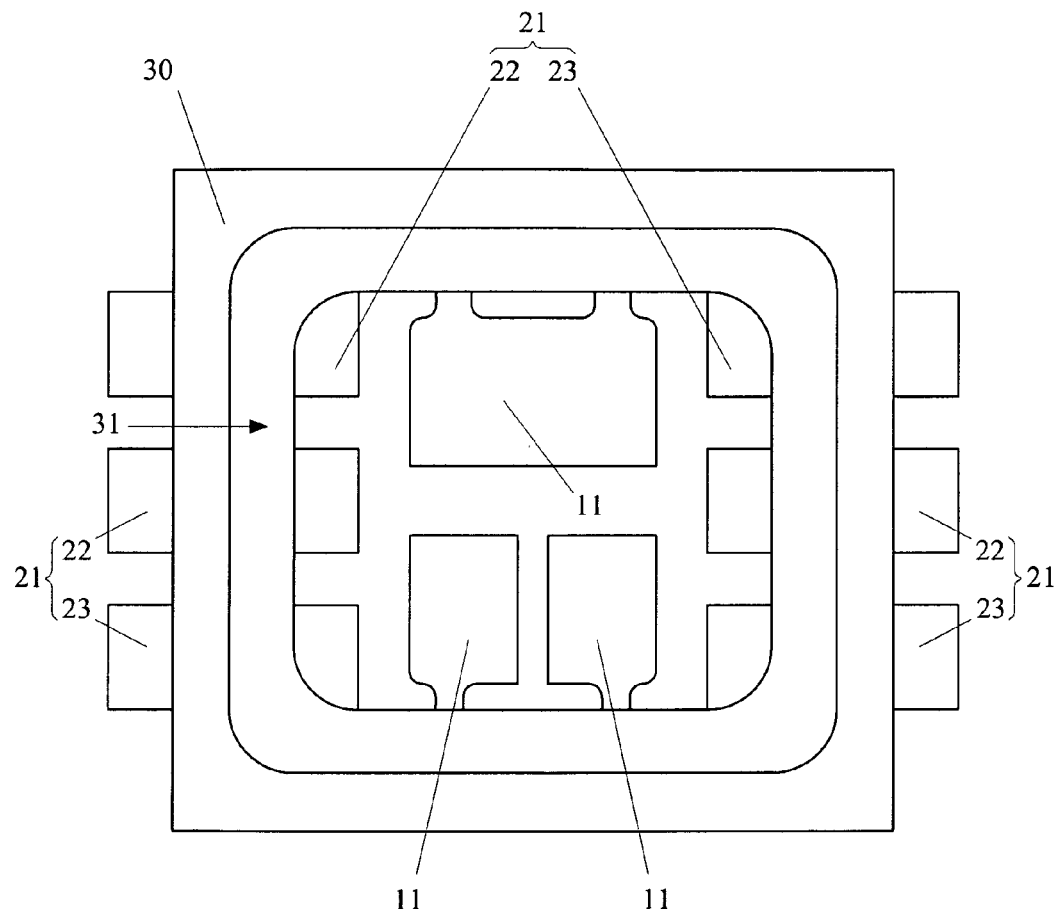
FIG. 5 is a top view of the disclosed electro-thermal separation type LED support structure.

Please refer to FIGS. 3 and 5 simultaneously. FIG. 5 is a top view of the disclosed electro-thermal separation type LED support structure. After using the above-mentioned procedure to make the heat dissipation plate 10 with at least two heat dissipation bases 11 and the support plate 20 with at least two conductive supports 21 that are separate from each other and coupling the heat dissipation plate 10 and the support plate 20, a plastic base 30 is formed by insert molding so that each of the heat dissipation bases 11 and each of the conductive supports 21 are partially embedded in the plastic base 30 (step 140). The actual production procedure only requires an upper mold (not shown) and a lower mold (not shown) to embed each of the heat dissipation bases 11 and each of the conductive supports 21 therein, followed by ejection molding to form the plastic base 30. That is, each of the heat dissipation bases 11 and each of the conductive supports 21 can be partially embedded in the plastic base 30 at the same time. The upper mold and the lower mold can be removed at a time, thereby completing insert molding of the plastic base 30. The material of the plastic base 30 can be polyphthalamide (PPA) or other common thermal plastic resin for the LED structure plastic base 30. The invention does not restrict the material of the plastic base 30.

While forming the plastic base 30 by ejection molding, the plastic base 30 is formed with a concave part 31 concurrently. Each of the heat dissipation bases 11 and each of the conductive supports 21 are partially exposed in the concave part 31 of the plastic base 30 (step 140). Each of the conductive supports 21 partially extends out of the plastic base 30 (step 140).

The part of each conductive support 21 exposed in the concave part 31 of the plastic base 30 and the part of each conductive support 21 extending out of the plastic base 30 are for electrical connections. That is, the part of each conductive support 21 exposed in the concave part 31 of the plastic base 30 electrically connects to the LED chip (not shown) configured on each of the heat dissipation bases 11 subsequently. The part of each conductive support 21 extending out of the plastic base 30 also forms an electrical connection outside the plastic base 30 for other electronic devices, such as a motherboard, circuit board, etc (not shown) to connect. The invention does not restrict the application scope to the ones mentioned herein.

In other words, the LED chip (not shown) subsequently configured on each of the heat dissipation bases 11 in the concave part 31 of the plastic base 30 dissipates its heat via the corresponding heat dissipation base 11. The part of each conductive support 21 exposed in the concave part 31 of the plastic base 30 is for the electrical connection of the LED chip. The part of each conductive support 21 extending out of the plastic base 30 is for the electrical connection of the LED chip with other electronic devices.

The electro-thermal separation type LED support structure formed from the above-mentioned procedure is shown in FIG. 5.

Figure 6:
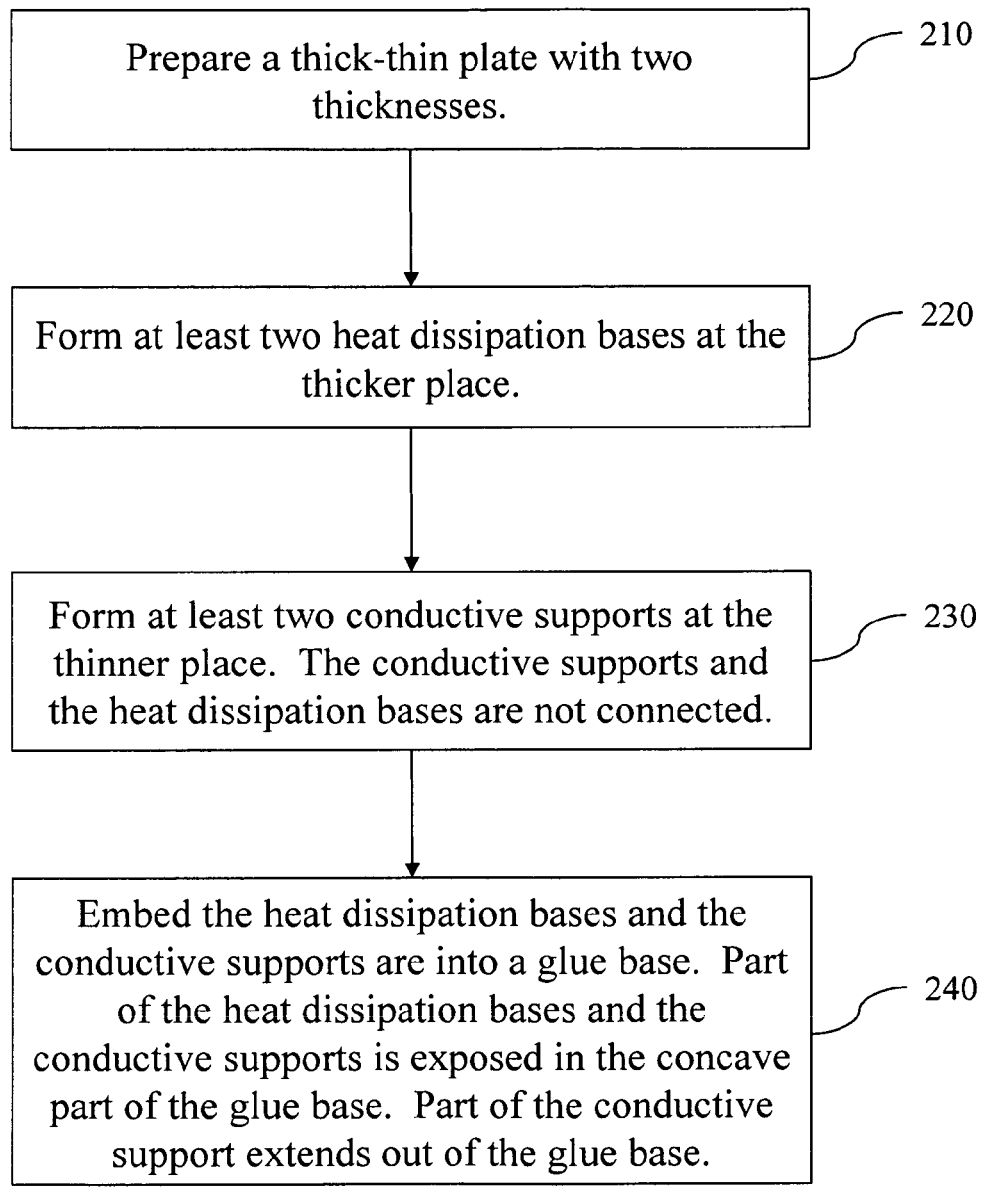
FIG. 6 is a flowchart of the method for producing an electro-thermal separation type LED support structure according to the second embodiment of the invention.
Figure 7A:
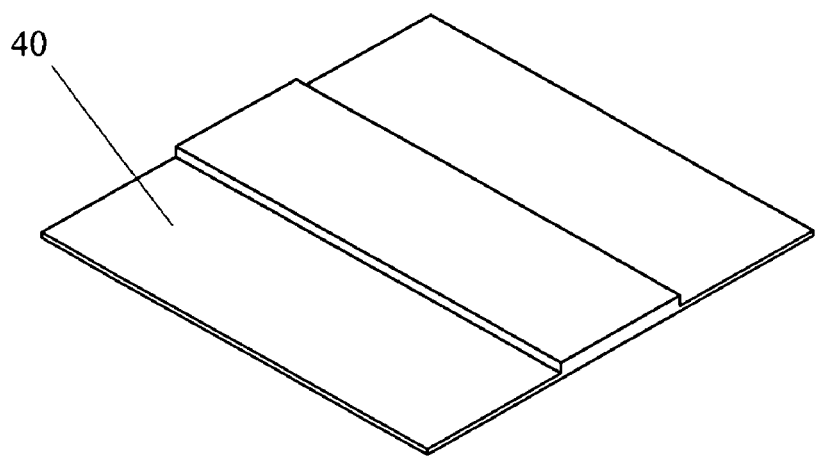
FIG. 7A is a three-dimensional view of the thick-thin plate in the disclosed electro-thermal separation type LED support structure.

The following paragraphs describe a second embodiment of the method for producing the electro-thermal separation type LED support structure. Please simultaneously refer to FIGS. 6 and 7A. FIG. 6 is a flowchart of the method for producing the electro-thermal separation type LED support structure according to the second embodiment. FIG. 7A is a three-dimensional view of the thick-thin plate for the electro-thermal separation type LED support structure. First, a thick-thin plate 40 with two thicknesses is formed by extrusion (step 210). The above-mentioned example should not be used to restrict the scope of the invention.

Figure 7B:
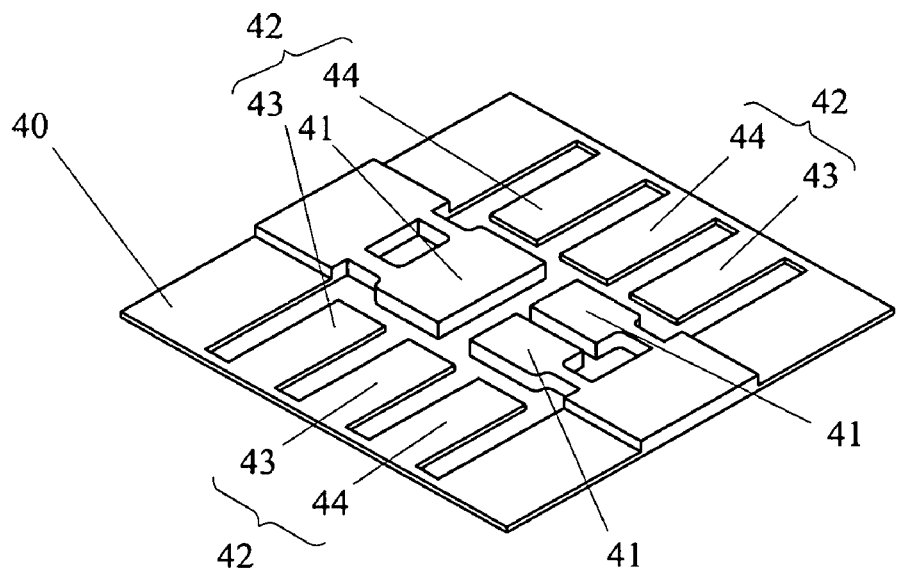
FIG. 7B is a three-dimensional view of heat dissipation bases and the conductive supports on the thick-thin plate in the disclosed electro-thermal separation type LED support structure.

Please refer simultaneously to FIGS. 6 and 7B. FIG. 7B is a three-dimensional view of the heat dissipation base and conductive support made of the thick-thin plate. The thicker place of the thick-thin plate 40 is formed with at least two heat dissipation bases 41 by stamping (step 220). Also, the thinner place of the thick-thin plate 40 is formed with at least two conductive supports 42 by stamping (step 230).

The number of the conductive supports 42 formed on the thick-thin plate 40 is determined by the number of the heat dissipation bases 41 formed on the thick-thin plate 40. That is, the number of the conductive supports 42 formed on the thick-thin plate 40 is the same as the number of the heat dissipation bases 41 formed on the thick-thin plate 40. Moreover, each of the conductive supports 42 has an anode conductive support 43 and a cathode conductive support 44.

As shown in FIGS. 7A and 7B, the thick-thin plate 40 is formed with three heat dissipation bases 41. Therefore, there are three conductive supports 42 on the thick-thin plate 40. The numbers of the heat dissipation bases 41 and the conductive supports 42 are only illustrative. The invention is not limited to such examples.

It should be noted that the heat dissipation bases 41 and the conductive supports 42 formed on the thick-thin plate 40 are not connected. Therefore, heat dissipation and electrical connection are separate, resulting in electro-thermal separation.

The thick-thin plate 40 can be made of a metal plate or alloy plate of good electrical and thermal conductivities. For example, the thick-thin plate 40 can be Cu, Fe, Al, Cu alloy, Fe alloy, Al alloy or other materials with good electrical and thermal conductivities. Thus, the heat dissipation bases 11 and the conductive supports 21 have good electrical and thermal conductivities. The invention, however, is not limited to these examples.

Figure 8:
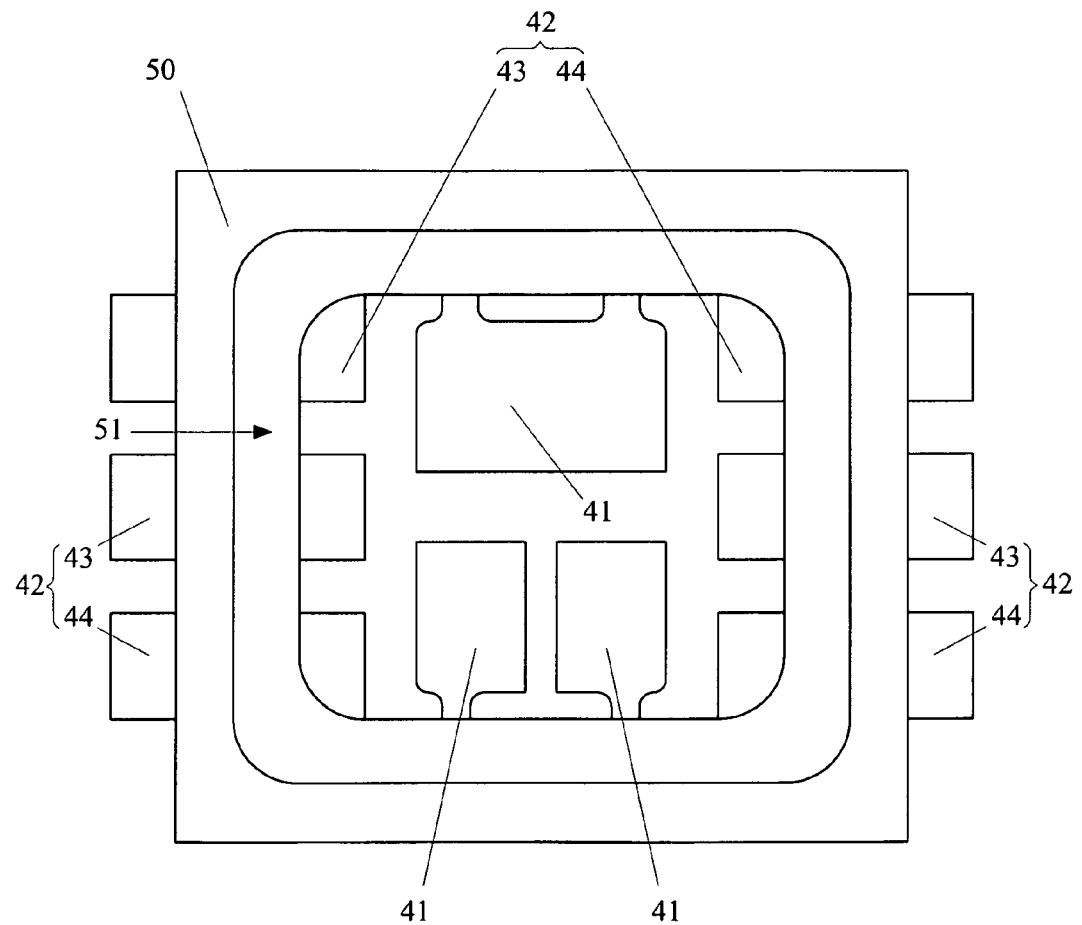
FIG. 8 is a top view of the disclosed electro-thermal separation type LED support structure.

Please refer simultaneously to FIGS. 6 and 8. FIG. 8 is a top view of the disclosed electro-thermal separation type LED support structure. After using the above-mentioned procedure to make the thick-thin plate 40 with at least two heat dissipation bases 41 and at least two conductive supports 42 that are separate from each other, a plastic base 50 is formed by insert molding so that each of the heat dissipation bases 41 and each of the conductive supports 42 are partially embedded in the plastic base 50 (step 240). The actual production procedure only requires an upper mold (not shown) and a lower mold (not shown) to embed each of the heat dissipation bases 11 and each of the conductive supports 21 therein, followed by ejection molding to form the plastic base 50. That is, each of the heat dissipation bases 41 and each of the conductive supports 42 can be partially embedded in the plastic base 50 at the same time. The upper mold and the lower mold can be removed at a time, thereby completing insert molding of the plastic base 50. The material of the plastic base 50 can be polyphthalamide (PPA) or other common thermal plastic resin for the LED structure plastic base 50. The invention does not restrict the material of the plastic base 50.

While forming the plastic base 50 by ejection molding, a concave part 51 is formed therein. Each of the heat dissipation bases 41 and each of the conductive supports 42 are partially exposed in the concave part 51 of the plastic base 50 (step 240). Also, each of the conductive supports 42 partially extends out of the plastic base 50 (step 240).

The part of each conductive support 42 exposed in the concave part 51 of the plastic base 50 and the part of each conductive support 42 extending out of the plastic base 50 are for electrical connections. That is, the part of each conductive support 42 exposed in the concave part 51 of the plastic base 50 electrically connects to the LED chip (not shown) configured on each of the heat dissipation bases 41 subsequently. The part of each conductive support 42 extending out of the plastic base 50 also forms an electrical connection outside the plastic base 50 for other electronic devices, such as a motherboard, circuit board, etc (not shown) to connect. The invention does not restrict the application scope to the ones mentioned herein.

In other words, the LED chip (not shown) subsequently configured on each of the heat dissipation bases 41 in the concave part 51 of the plastic base 50 dissipates its heat via the corresponding heat dissipation base 41. The part of each conductive support 42 exposed in the concave part 51 of the plastic base 50 is for the electrical connection of the LED chip. The part of each conductive support 42 extending out of the plastic base 50 is for the electrical connection of the LED chip with other electronic devices.

The electro-thermal separation type LED support structure formed from the above-mentioned procedure is shown in FIG. 8.

Figure 9A:
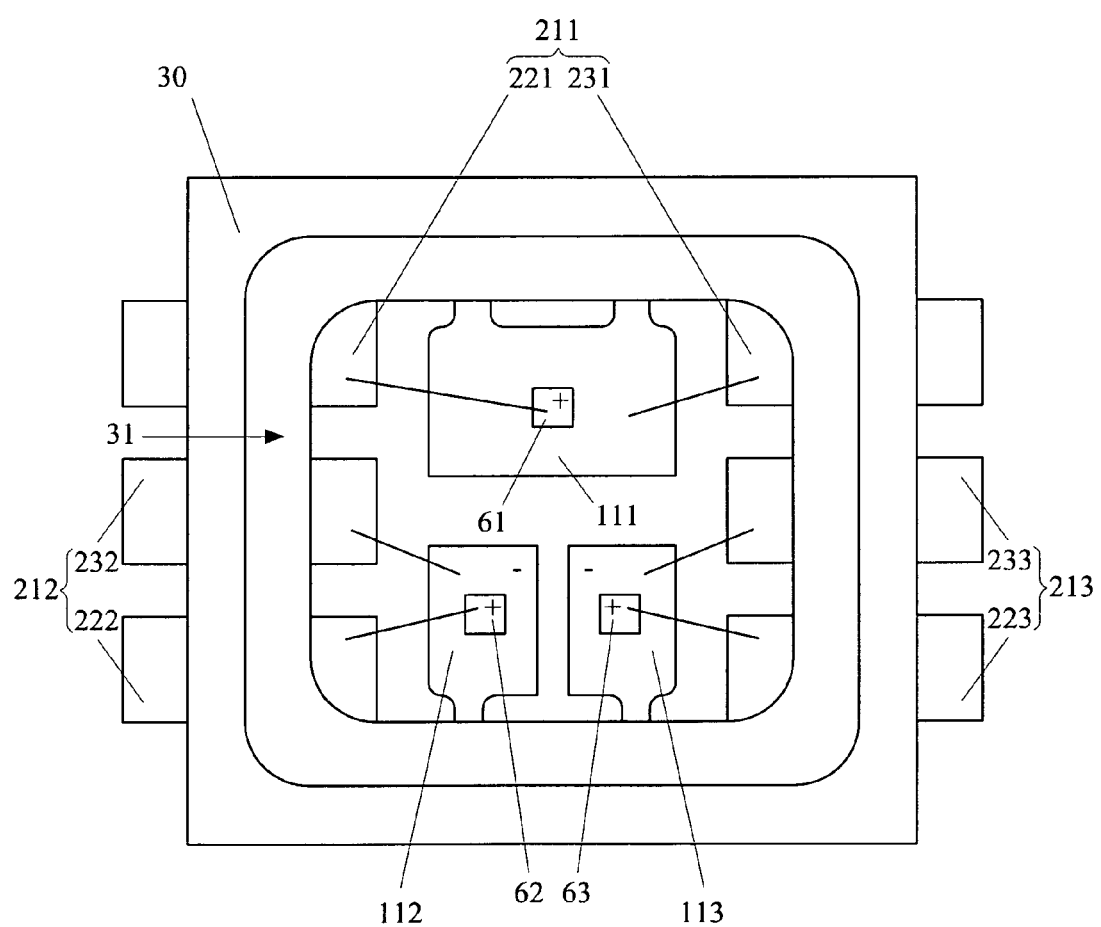
FIG. 9A is a top view of the first LED chip configuration on the disclosed electro-thermal separation type LED support structure.

Please refer to FIG. 9A, which is a top view of a first configuration of the LED chips on the disclosed electro-thermal separation type LED support structure.

This specification only uses the first embodiment to explain the configuration of LED chips. The configuration of LED chips in the second embodiment is the same as that in the first embodiment. Besides, the invention is not limited to such examples.

Using the SMD, the cathode of the first LED chip 61 is fixed on the first heat dissipation base 111 exposed in the concave part 31 of the plastic base 30, the cathode of the second LED chip 62 is fixed on the second heat dissipation base 112 exposed in the concave part 31 of the plastic base 30, and the cathode of the third LED chip 63 is fixed on the third heat dissipation base 113 exposed in the concave part 31 of the plastic base 30.

Afterwards, wire bonding is employed to electrically connect the anode of the first LED chip 61 with the anode conductive support 221 of the first conductive support 221 exposed in the concave part 31 of the plastic base 30. Also, the first heat dissipation base 111 (i.e., the cathode of the first LED chip 61) electrically connects to the cathode conductive support 231 of the first conductive support 211 exposed in the concave part 31 of the plastic base 30.

The anode of the second LED chip 62 and the anode conductive support 222 of the second conductive support 212 exposed in the concave part 31 of the plastic base 30 are electrically connected. The second heat dissipation base 112 (i.e., the cathode of the second LED chip 62) and the cathode conductive support 232 of the second conductive support 212 exposed in the concave part 31 of the plastic base 30 are electrically connected.

Finally, the anode of the third LED chip 63 electrically connects to the anode conductive support 223 of the third conductive support 213 exposed in the concave part 31 of the plastic base 30. The third heat dissipation base 113 (i.e., the cathode of the third LED chip 63) electrically connects to the cathode conductive support 223 of the third conductive support 213 exposed in the concave part 31 of the plastic base 30.

The first conductive support 211 provides different polarities for the first LED chip 61. The second conductive support 212 provides different polarities for the second LED chip 62. The second conductive support 213 provides different polarities for the second LED chip 33.

In addition to using wire bonding to form electrical connections between the first LED chip 61, the second LED chip 62, and the third LED chip 63 with the first conductive support 211, the second conductive support 212, and the third conductive support 213, respectively, the LED chips can be electrically connected with the conductive supports by flip chip bonding as well. The wire bonding and flip chip bonding techniques are well-known and not further described herein. These examples should not be used to restrict the scope of the invention.

Figure 9B:
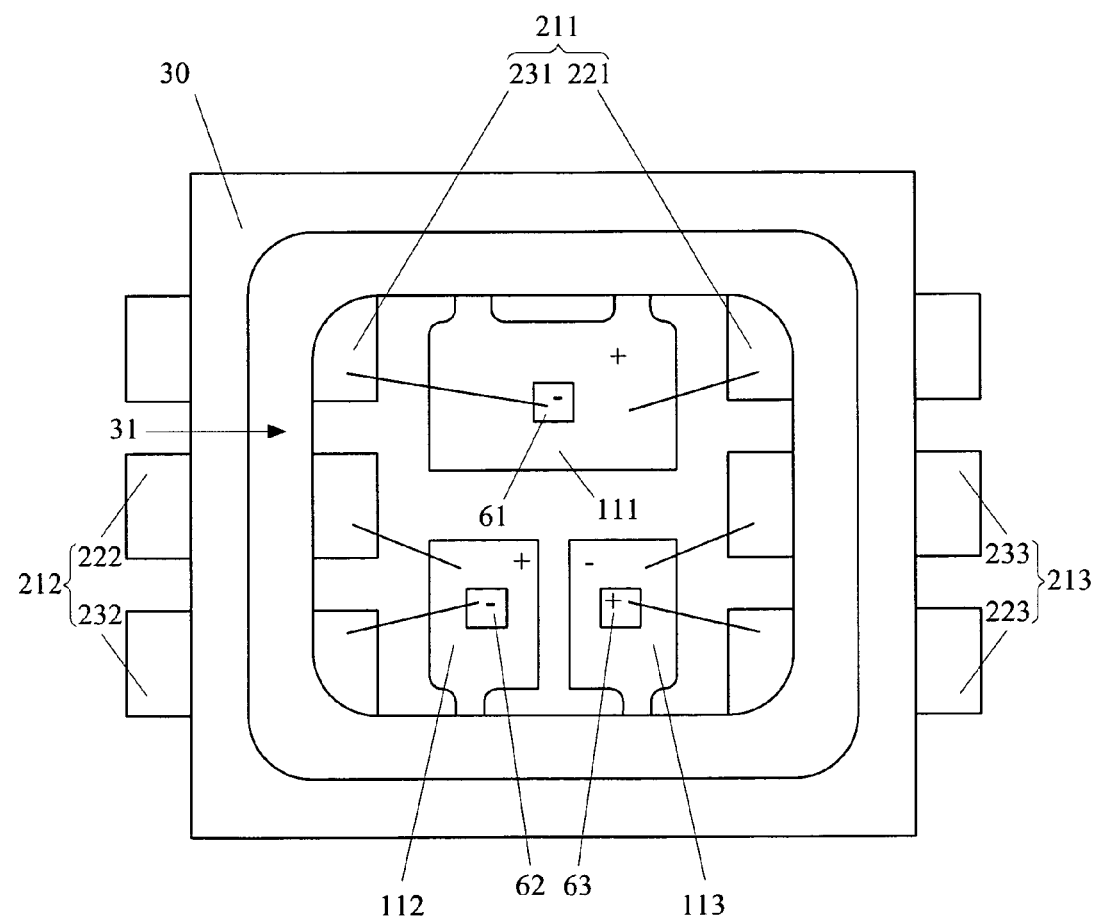
FIG. 9B is a top view of the second LED chip configuration on the disclosed electro-thermal separation type LED support structure.

Please refer to FIG. 9B, which is a top view of the second configuration embodiment of the LED chips on the disclosed electro-thermal separation type LED support structure.

In the second configuration embodiment, the anode of the first LED chip 61 is fixed on the first heat dissipation base 111 exposed in the concave part 31 of the plastic base 30, the anode of the second LED chip 62 is fixed on the second heat dissipation base 112 exposed in the concave part 31 of the plastic base 30, and the anode of the third LED chip 63 is fixed on the third heat dissipation base 113 exposed in the concave part 31 of the plastic base 30.

Afterwards, wire bonding is employed to electrically connect the cathode of the first LED chip 61 and the cathode conductive support 231 of the first conductive support 211 exposed in the concave part 31 of the plastic base 30. Moreover, the first heat dissipation base 111 (i.e., the anode of the first LED chip 61) and the anode conductive support 221 of the first conductive support 211 exposed in the concave part 31 of the plastic base 30 are electrically connected.

The cathode of the second LED chip 62 and the cathode conductive support 232 of the second conductive support 212 exposed in the concave part 31 of the plastic base 30 are electrically connected. Moreover, the second heat dissipation base 112 (i.e., the anode of the second LED chip 62) and the anode conductive support 222 of the second conductive support 212 exposed in the concave part 31 of the plastic base 30 are electrically connected.

Finally, the anode of the third LED chip 63 and the anode conductive support 223 of the third conductive support 213 exposed in the concave part 31 of the plastic base 30 are electrically connected. Moreover, the third heat dissipation base 113 (i.e., the anode of the third LED chip 63) and the cathode conductive support 233 of the third conductive support 213 exposed in the concave part 31 of the plastic base 30 are electrically connected.

The first conductive support 211 provide different polarities to the first LED chip 61, the second conductive support 212 provide different polarities to the second LED chip 62, and the third conductive support 213 provide different polarities to the first LED chip 63.

Please simultaneously refer to FIGS. 9A and 9B. Through the first conductive support 211, the second conductive support 212, and the third conductive support 213, the first LED chip 61, the second LED chip 62, and the third LED chip 63 can be controlled respectively. LED chips of different types (PNP type or NPN type) can be used to enhance the efficiency.

FIGS. 9A and 9B only provide two LED configurations and electrical connections. The invention is not limited to these examples.

Figure 10:
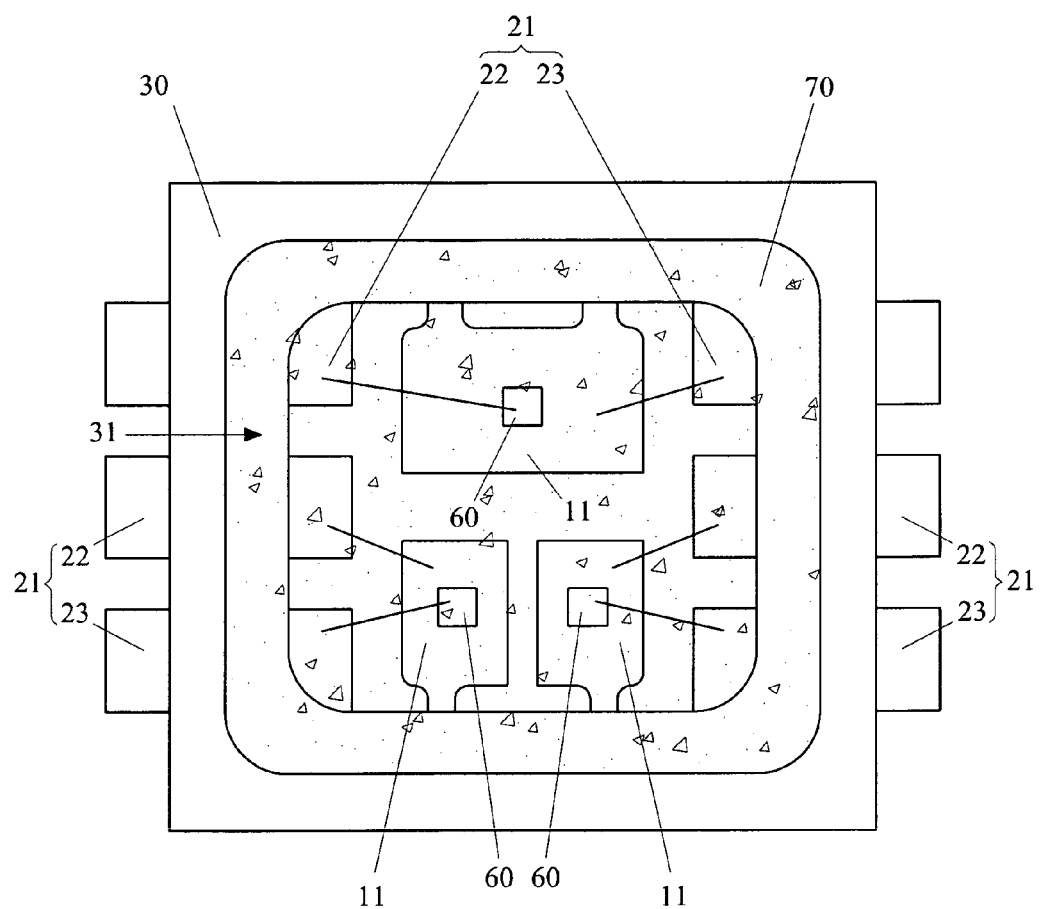
FIG. 10 is a top view of packaging the LED chip in the disclosed electro-thermal separation type LED support structure.

Please refer to FIG. 10, which is a top view of using the disclosed electro-thermal separation type LED support structure to package LED chips.

This specification uses only the first embodiment for explaining the configuration of LED chips. The LED chip configuration in the second embodiment is the same as the first embodiment. The invention, however, is not limited to these illustrative examples.

The concave part 31 of the plastic base 30 is filled with packaging glue 70. The packaging glue 70 thus covers the LED chip 60 in the concave part 31. The packaging glue 70 can be formed by dispensing. This is only an example, and should not be used to restrict the scope of the invention. Moreover, the packaging glue 70 is doped with fluorescent powders. Therefore, when the light emitted by the LED chip 60 irradiates on the fluorescent powders so that another color of visible light is excited, the light emitted by the LED chip 60 mixes with the light emitted by the fluorescent powders to produce a light-mixing effect.

In summary, the invention differs from the prior art in that the heat dissipation plate and the support plate are coupled to form at least two heat dissipation bases and at least two conductive supports to achieve electro-thermal separation according to one embodiment. According to another embodiment, a thick-thin plate is used to form at least two heat dissipation bases and at least two conductive supports to achieve electro-thermal separation. Moreover, LED chips of different types can be used simultaneously. That is, LED chips of different types can be configured on the heat dissipation bases to form electrical connections with different conductive supports. Such a freedom in the choice of LED chips of different types removes the constraint on the uses of LED chips.

The disclosed techniques can be used to solve the problem in the prior art that only LED chips of the same type can be used on the heat dissipation bases. The invention achieves the goal of implementing LED chips of different types on the heat dissipation bases simultaneously.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A method for producing a electro-thermal separation type LED support structure, comprising the steps of:
   forming at least two heat dissipation bases on a heat dissipation plate;
   forming at least two conductive supports on a support plate;
   coupling the heat dissipation plate and the support plate so that the heat dissipation bases are disposed between the conductive supports and the heat dissipation bases and the conductive supports are not connected; and
   partially embedding the heat dissipation bases and the conductive supports in a plastic base, with part of the heat dissipation bases and the conductive supports being exposed in a concave part of the plastic base and part of the conductive supports extending out of the plastic base.

2. The method of claim 1, wherein the step of forming at least two heat dissipation bases on a heat dissipation plate is achieved by stamping.

3. The method of claim 1, wherein the step of forming at least two conductive supports on a support plate is achieved by stamping.

4. The method of claim 1, wherein part of the heat dissipation bases is exposed in the concave part to fix the LED chip and the LED chip electrically connects to any of the conductive supports partially exposed in the concave part in the step of partially embedding the heat dissipation bases and the conductive supports in a plastic base, with part of the heat dissipation bases and the conductive supports being exposed in a concave part of the plastic base and part of the conductive supports extending out of the plastic base.

5. The method of claim 4, wherein the step of partially embedding the heat dissipation bases and the conductive supports in a plastic base, with part of the heat dissipation bases and the conductive supports being exposed in a concave part of the plastic base and part of the conductive supports extending out of the plastic base further includes the step of covering a packaging glue in the concave part.

6. A method for producing an electro-thermal separation type LED support structure, comprising the steps of:
   preparing a thick-thin plate of two thicknesses;
   forming at least two heat dissipation bases at the thicker place of the thick-thin plate;
   forming at least two conductive supports at the thinner place of the thick-thin plate, wherein the conductive supports and the heat dissipation bases are not connected; and
   partially embedding the heat dissipation bases and the conductive supports in a plastic base, with part of the heat dissipation bases and the conductive supports exposed in a concave part of the plastic base and part of the conductive supports extending out of the plastic base.

7. The method of claim 6, wherein the step of forming at least two heat dissipation bases at the thicker place of the thick-thin plate is achieved by stamping.

8. The method of claim 6, wherein the step of forming at least two conductive supports at the thinner place of the thick-thin plate, wherein the conductive supports and the heat dissipation bases are not connected, is achieved by stamping.

9. The method of claim 6, wherein part of the heat dissipation bases is exposed in the concave part to fix the LED chip and the LED chip electrically connects to any of the conductive supports partially exposed in the concave part in the step of partially embedding the heat dissipation bases and the conductive supports in a plastic base, with part of the heat dissipation bases and the conductive supports being exposed in a concave part of the plastic base and part of the conductive supports extending out of the plastic base.

10. The method of claim 9, wherein the step of partially embedding the heat dissipation bases and the conductive supports in a plastic base, with part of the heat dissipation bases and the conductive supports being exposed in a concave part of the plastic base and part of the conductive supports extending out of the plastic base further includes the step of covering a packaging glue in the concave part.

* * * * *